United States Patent [19]
MacWilliams et al.

[11] Patent Number: 6,128,748
[45] Date of Patent: Oct. 3, 2000

[54] INDEPENDENT TIMING COMPENSATION OF WRITE DATA PATH AND READ DATA PATH ON A COMMON DATA BUS

[75] Inventors: Peter D. MacWilliams, Aloha; Duane G. Quiet, Hillsboro, both of Oreg.

[73] Assignee: Intel Corporation, Santa Clara, Calif.

[21] Appl. No.: 09/047,978

[22] Filed: Mar. 25, 1998

[51] Int. Cl.[7] ...................................................... G06F 1/12
[52] U.S. Cl. ............................................ 713/401; 713/503
[58] Field of Search ................................... 713/400, 401, 713/500, 501, 503, 600

[56] References Cited

U.S. PATENT DOCUMENTS

| | | | |
|---|---|---|---|
| 5,448,715 | 9/1995 | Lelm et al. ............................. | 713/600 |
| 5,815,462 | 9/1998 | Konishi et al. ......................... | 365/233 |
| 5,889,726 | 3/1999 | Jeddeloh ................................. | 365/233 |
| 5,926,838 | 7/1999 | Jeddeloh ................................. | 711/167 |

*Primary Examiner*—Dennis M. Butler
*Attorney, Agent, or Firm*—Blakely, Sokoloff, Taylor & Zafman LLP

[57] ABSTRACT

An apparatus includes a read clock path to provide a read clock signal to a memory controller, wherein the read clock signal is to control timing of a memory controller when reading from a memory. The apparatus also includes a write clock path, independent of the read clock path, to provide a write clock signal to the memory controller, wherein the write clock signal is to control timing of the memory controller when writing to the memory.

33 Claims, 7 Drawing Sheets

INDEPENDENT TIMING COMPENSATION OF WRITE DATA PATH AND READ DATA PATH ON A COMMON DATA BUS

BACKGROUND OF THE INVENTION

Field of the Invention

The present invention pertains to synchronous devices and clock signal paths. More particularly, this invention relates to independent timing compensation of write data paths and read data paths on a common data bus.

Background

Modern computer systems use a wide range of devices to perform their various functions. Many of these devices include components which are controlled or "clocked" by a clock signal, referred to as synchronous components. In general, the clock signal in a device is used to identify when signals are to be transferred between components. Examples of devices which incorporate synchronous components include memory arrays and memory controllers. Memory arrays typically include multiple cells, with the timing of the input of data to and the output of data from the cells being controlled by a clock signal. Similarly, control logic of the memory controllers are typically controlled by a clock signal.

Two issues which typically arise when using synchronous systems are the setup time and the hold time for signals. Control and data signals typically need to be provided on a signal line between two components by the source component at their intended state at the destination component for at least a first period of time prior to the clock signal indicating the destination component can sample the state of the line. This first period of time is referred to as the setup time. Additionally, control and data signals typically need to be present on the line at their intended state at the destination component for at least a second period of time in order for the destination component to accurately sample the state of the line. This second period of time is referred to as the hold time.

Typically, the timing margin for setup times is dependent on the clock period, the clock to output propagation delay of the driving component (the source of the data), the signal flight time (the propagation delay in the board), the setup time for the receiver component, the cycle to cycle jitter in the clock signal (the variation between consecutive clock periods), and the clock signal skew (the uncertainty of clock edges across all components and board interconnects at the receiver pins). Additionally, the timing margin for hold times is dependent on the clock to output propagation delay of the driving component, the signal flight time, the hold time for the receiver component, and the clock signal skew.

There are typically four timing margins a system designer is concerned with: the setup margin for memory reads, the setup margin for memory writes, the hold margin for memory reads, and the hold margin for memory writes. However, modification of one of these margins can adversely affect one or more of the others. By way of example, the signal flight timing can be increased by adding trace length to the board in the data path between the driver and the receiver. Although such an increase may improve one of the margins, such as the hold margin for memory writes, it can cause another margin, such as the setup margin for memory reads, to be unacceptable.

An additional problem with altering the data path is the increased data path widths of modern computer systems. Typically, modern computer systems transfer data in parallel having data buses or paths which are 32 or 64 bits wide. Thus, altering trace length of a single data path requires altering the trace of each of the 32 or 64 parallel bit paths.

Therefore, a need exists for a more flexible way of providing clock signals to synchronous components.

SUMMARY OF THE INVENTION

An apparatus is disclosed which includes a read clock path to provide a read clock signal to a memory controller, wherein the read clock signal is to control timing of a memory controller when reading from a memory. The apparatus also includes a write clock path, independent of the read clock path, to provide a write clock signal to the memory controller, wherein the write clock signal is to control timing of the memory controller when writing to the memory.

A method is disclosed which includes providing a read clock signal to control timing of a memory controller when reading from a memory, and providing a write clock signal, independent of the read clock signal, to control timing of the memory controller when writing to the memory.

A memory controller is also disclosed which includes a first plurality of latches, operating in a first time domain, to transfer data from a memory array, and a second plurality of latches, operating in a second time domain different than the first time domain, to transfer data to the memory array. According to one embodiment, the first plurality of latches are coupled to a read clock path, the second plurality of latches are coupled to a write clock path, and the delay of the write clock path is independent of the delay of the read clock path.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In the following description, various aspects of the present invention will be described. However, it will be understood by those skilled in the art that the present invention may be practiced with only some or all aspects of the present invention. For purposes of explanation, specific numbers, materials and configurations are set forth in order to provide a thorough understanding of the present invention. However, it will also be apparent to those skilled in the art that the present invention may be practiced without these specific details.

Figure 1:
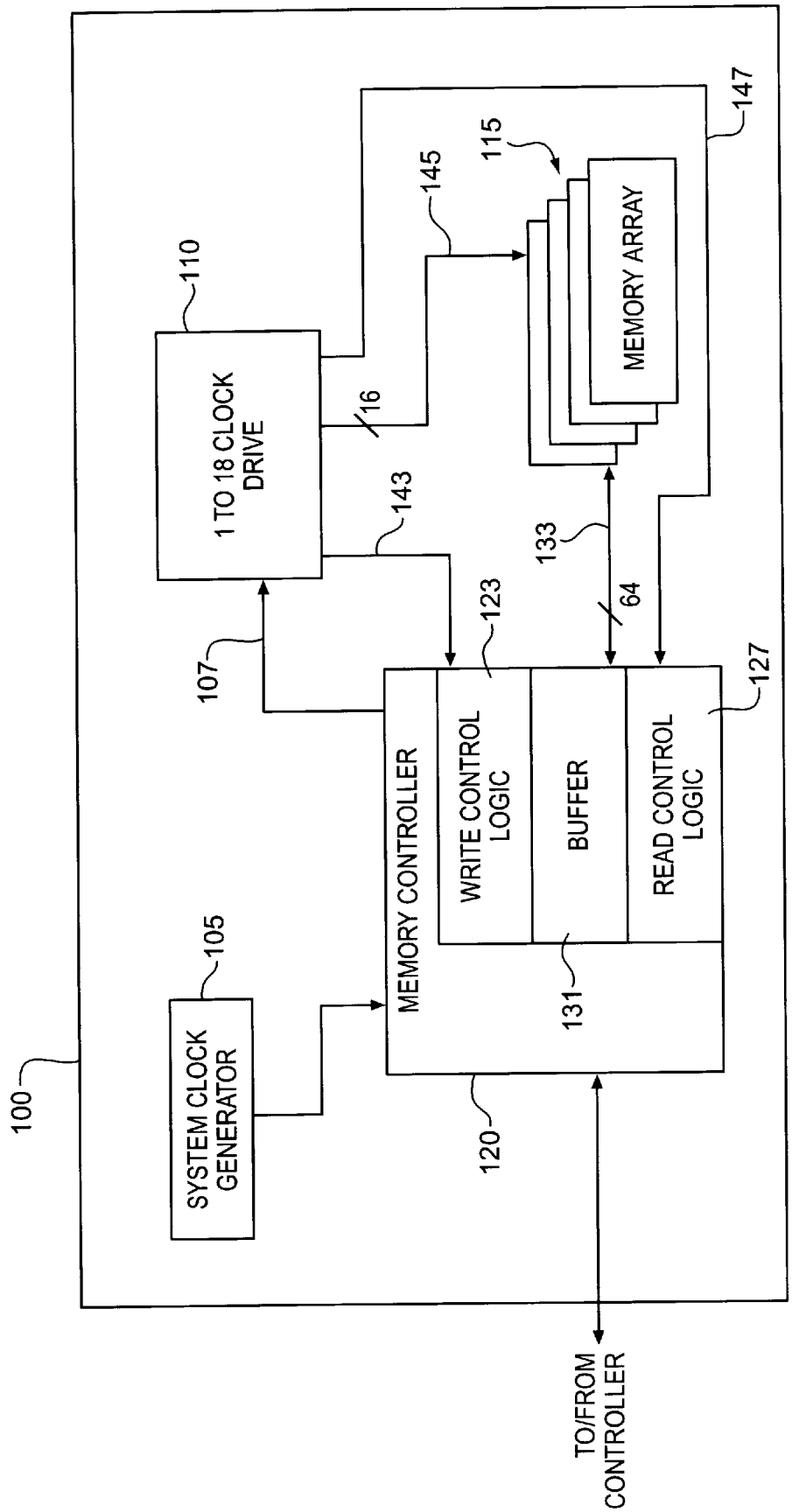
FIG. 1 is a block diagram illustrating independent read and write clock signals in a subsystem according to one embodiment of the present invention.

FIG. 1 is a block diagram illustrating independent read and write clock signals in a subsystem according to one embodiment of the present invention. As illustrated, a subsystem 100 includes a system clock generator 105, a clock driver 110, a memory controller 120, and memory arrays 115. In the illustrated embodiment, generator 105, driver 110, controller 120, and arrays 115 are all implemented on a printed circuit board (PCB) often referred to as the "motherboard" of a computer system. Each of generator 105, driver 110, controller 120, and arrays 115 can be "permanently" connected to the motherboard, or alternatively can be removably connected to the motherboard, such as by being inserted into a connector disposed on the motherboard. Generator 105, driver 110, controller 120, and arrays 115 are interconnected via multiple signal lines, also referred to as "traces". These signal lines, along with any additional circuitry in or on the line, are also referred to as the signal paths.

Memory arrays 115 include a plurality of memory arrays clocked by driver 110. In the illustrated embodiment, memory arrays 115 includes multiple dynamic random access memory (DRAM) cells arranged as multiple dual in-line memory modules (DIMMs). Each of the DIMMs is clocked by multiple clock signals from memory clock signal paths 145. In alternate embodiments, the memory arrays 115 comprise other types of memory, such as direct RDRAM.

System clock generator 105 generates and provides a system clock signal to memory controller 120, which in turn provides the system clock signal to clock driver 110 via a system clock signal path 107. In the illustrated embodiment, driver 110 is a one to n driver which receives the system clock signal and provides the system clock signal as n separate output signals, with n being an integer (e.g., 18). Clock driver 110 provides (n-2) substantially identical memory clock signals to memory arrays 115 via memory clock signal paths 145, a clock signal to write control logic 123 of memory controller 120 via a "short" clock signal path 143, and a clock signal to read control logic 127 of memory controller 120 via a "long" clock signal path 147. In the illustrated embodiment, clock driver 110 operates in a conventional manner to provide clock signals 143, 145, and 147. No changes to clock driver 110 are necessary to carry out the present invention.

Clock signal path 143 is referred to as a "short" clock signal path because the time required for a clock signal to propagate from driver 110 to write control logic 123 is shorter than the time required for a clock signal to propagate from driver 110 to memory arrays 115 via memory clock signal path 145. Similarly, clock signal path 147 is referred to as a "long" clock signal path because the time required for a clock signal to propagate from driver 110 to read control logic 127 via signal path 147 is longer than the time required for a clock signal to propagate from driver 110 to memory arrays 115 via memory clock signal path 145. The lengths and/or delays of the "short" and "long" clock signal paths can be increased or decreased at the board level, as discussed in more detail below.

Thus, it can be seen that memory controller 120 and memory arrays 115 as illustrated in FIG. 1 operate in three different time domains. These three time domains are the memory clock domain (according to the clock signals on path 145), the read clock domain (according to the clock signals on long path 147), and the write clock domain (according to the clock signals on short path 143).

During operation, requests for access to memory arrays 115 are received from an external bus (not shown in FIG. 1) by memory controller 120. In the event of a write access, the write data associated with the access is received from the external bus and stored temporarily in data buffer 131. Write control logic 123, clocked by the clock signal on short clock signal path 143, controls the transfer of the write data from buffer 131 to memory arrays 115 via data signal lines 133. Any necessary control signals, including, for example, a row address strobe (RAS) and column address strobe (CAS) are also provided to memory arrays 115 by write control logic 123 as clocked by the clock signal on short clock signal path 143. Alternatively, the write control signals could be clocked by another clock signal (not shown) independent of clock signal path 143.

In the event of a read access, read control logic 127, clocked by the clock signal on long clock signal path 147, provides control signals to memory array 115 to control the reading of data associated with the read access from memory arrays 115 to data buffer 131 via data signal lines 133. Data read from memory arrays 115 is stored temporarily in data buffer 131, and from buffer 131 is transferred out of the subsystem 100. Alternate embodiments can include independent read and write buffers rather than the shared buffer illustrated in FIG. 1. Thus, a common data bus, signal lines 133, is used for the bi-directional transfer of data between memory controller 120 and memory arrays 115. Alternatively, the read control signals could be clocked by another clock signal (not shown) independent of clock signal path 147.

The time required for a clock signal to propagate to its destination via any one of clock signal paths 143, 145, or 147 can be altered or compensated for by changing the delay in the corresponding clock signal path 143, 145, or 147 relative to the other clock signal paths. The clock signal paths 143, 145, and/or 147 can be altered during the design of subsystem 100, but remains static during operation of the subsystem 100. Any one or more of the clock signal paths 143, 145, and 147 can be altered independent of the other(s).

As illustrated in FIG. 1, the delay of the clock signal which clocks write control logic 123, received via short clock signal path 143, is independent of the delay of the clock signal which clocks read control logic 127, received via long clock signal path 147. Thus, any compensation of the write clock signal by altering the delay on short clock signal path 143 affects write control logic 123 but does not affect read control logic 127. Similarly, any compensation of the read clock signal by altering the delay on long clock signal path 147 affects read control logic 127 but does not affect write control logic 123.

Additionally, it should be noted that short clock signal path 143 and long clock signal path 147 can each be compensated by altering the delay on a single line (e.g., path 143 or path 147). Compensation of multiple data lines (e.g., all 64 data signals 133) is not necessary. That is, the delay on the clock signal lines themselves is altered rather than the altering of any delay on the data lines.

The amount of delay in a particular signal path is dependent on various factors, including the length of the path as well as any additional circuitry in the path. Delays in a clock signal path can be altered in any of a wide range of manners. Examples of ways to alter delays in a clock signal path include: decreasing the length of the signal line, increasing the length of the signal line, inserting a delay element such as a buffer or a capacitor, or a resistor, changing the load on the line, changing the impedance of the line (e.g., by altering the width of the trace), etc.

Figure 2A:
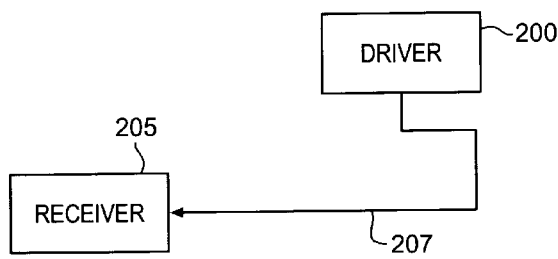
FIGS. 2a, 2b, 2c, 2d, and 2e illustrate different ways for increasing or decreasing delay in a signal path according to one embodiment of the present invention.

FIGS. 2a, 2b, 2c, 2d, and 2e illustrate different ways for increasing or decreasing delay in a signal path according to one embodiment of the present invention. As illustrated in FIG. 2a, a driver 200 provides a signal to a receiver 205 via a signal path 207. It is to be appreciated that driver 200 can be any source of a signal, such as driver 110 of FIG. 1. Similarly, receiver 205 can be any receiver of a signal, such as write control logic 123 or read control logic 127 of FIG. 1. After assertion of a signal by driver 200 on signal path 207, the signal can be sampled by receiver 205 after a period of time. The amount of time required for the signal to propagate from driver 200 to receiver 205 via signal path 207 is referred to as the delay of the signal path.

Figure 2B:
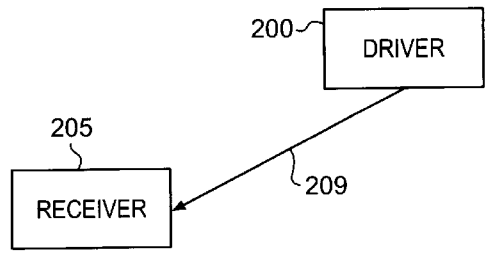

FIG. 2b illustrates driver 200, receiver 205, and a signal path 209. Assuming other factors are unchanged, the delay imposed by signal path 209 is less than the delay imposed by signal path 207 of FIG. 2a due to signal path 209 being shorter than signal path 207.

Figure 2C:
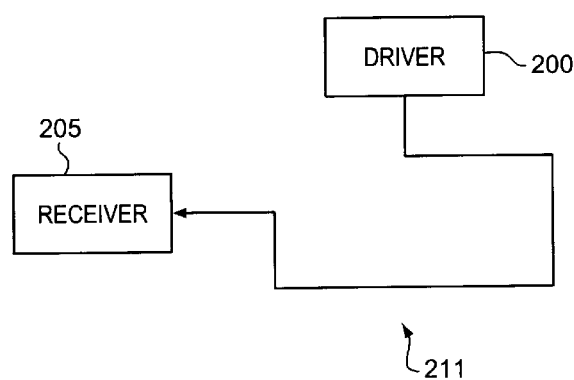

FIG. 2c illustrates driver 200, receiver 205, and a signal path 211. Assuming other factors are unchanged, the delay imposed by signal path 211 is greater than the delay imposed by signal path 207 of FIG. 2a due to signal path 211 being longer than signal path 207.

Figure 2D:
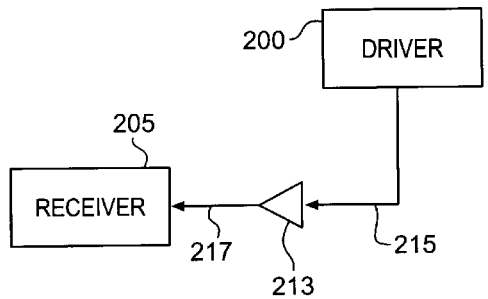

FIG. 2d illustrates driver 200, receiver 205, and a signal path including signal line 215, signal line 217, and a buffer 213. Assuming other factors are unchanged, the delay imposed by the signal path of line 215, buffer 213, and line 217 is greater than the delay imposed by signal path 207 of FIG. 2a due to the additional delay caused by buffer 213.

Figure 2E:
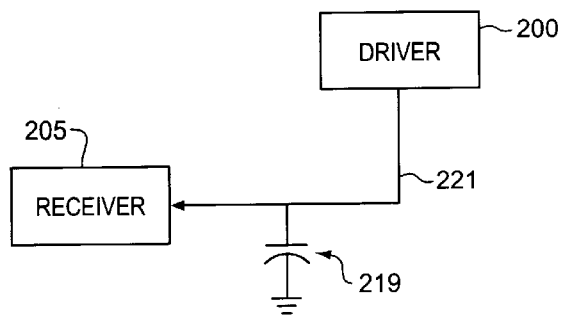

FIG. 2e illustrates driver 200, receiver 205, a signal path 221 and a capacitor 219 in parallel with path 221. Assuming other factors are unchanged, the delay imposed by the signal path of line 221 and capacitor 219 is greater than the delay imposed by signal path 207 of FIG. 2a due to the additional delay caused by buffer capacitor 219.

Returning to FIG. 1, in the illustrated embodiment, short clock signal path 143 clocks write control logic 123. By having the delay of clock signal path 143 less than the delay of clock signal paths 145, write control logic 123 receives its clock signals prior to memory arrays 115 receiving their clock signals. This earlier signaling causes write control logic 123 to begin its operation for transferring data from buffer 131 to memory array 115 prior to memory array 115 beginning its operation for receiving the data from buffer 131. Therefore, the setup time constraints are reduced, providing additional time for write control logic 123 to have the data ready on data lines 133 before memory arrays 115 receive a clock signal via clock signal paths 145.

Additionally, long clock signal path 147 clocks read control logic 127. By having the delay of clock signal path 147 greater than the delay of clock signal paths 145, read control logic 127 receives its clock signals after memory arrays 115 receive their clock signals. This later signaling allows memory arrays 115 to begin operation for transferring data from memory arrays 115 to buffer 131 prior to read control logic 127 beginning the clock cycle in which it expects to receive the data. Therefore, the setup time constraints for the memory arrays 115 are reduced.

Figure 3:
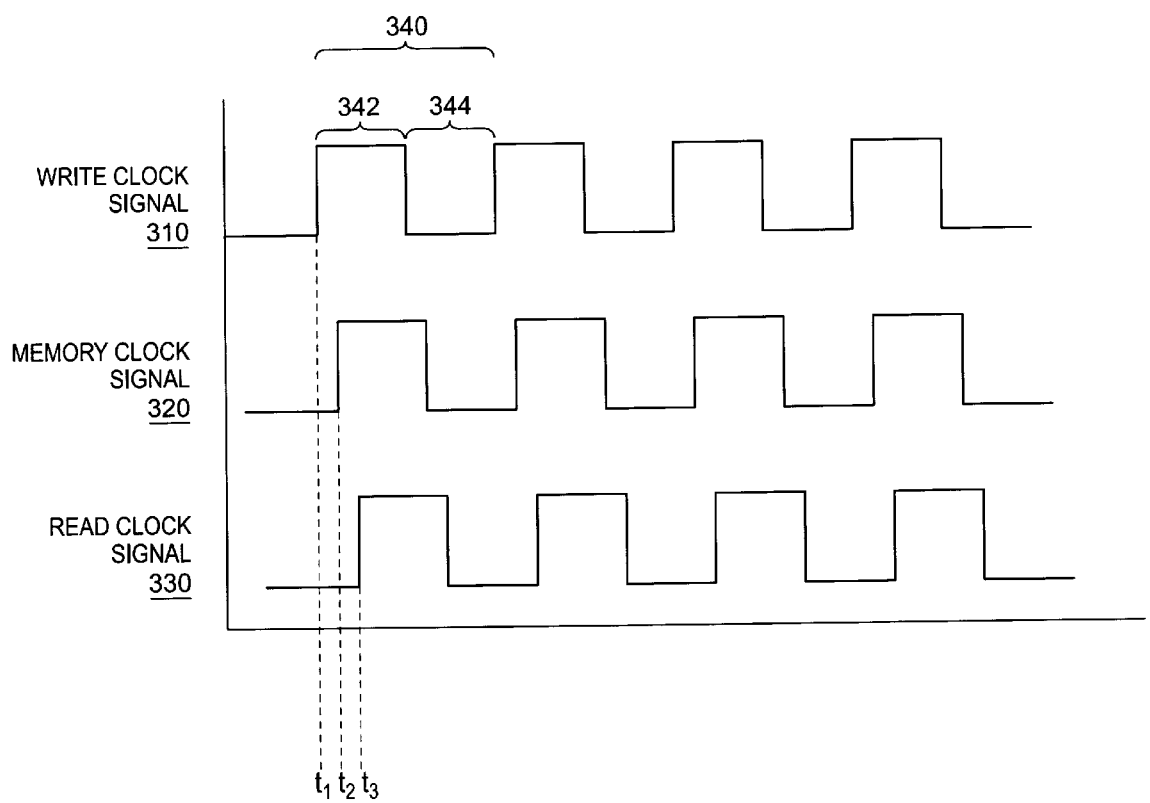
FIG. 3 is a timing diagram illustrating the clock signals provided according to one embodiment of the present invention.

FIG. 3 is a timing diagram illustrating the clock signals provided according to one embodiment of the present invention. Each of the clock signals have multiple clock periods, such as clock period 340 of write clock signal 310. Each clock period includes two phases, one when the clock signal has a "low" value (e.g., phase 342) and one when the clock signal has a "high" value (e.g., phase 344).

A write clock signal 310, a memory clock signal 320, and a read clock signal 330 are illustrated. In the illustrated embodiment write clock signal 310 is provided from driver 110 to write control logic 123 via short clock signal path 143, memory clock signal 320 is provided to a memory array 115 from driver 110 via a memory clock signal path 145, and read clock signal 330 is provided to read control logic 127 from driver 110 via long clock signal path 147.

As illustrated, all three clock signals are skewed slightly from each other. By way of example, the rising edge of write clock signal 310 arrives at write control logic 123 a period of time earlier than the rising edge of memory clock signal 320 arrives at a memory array 115, illustrated as time $t_2$ minus time $t_1$. This gives write control logic 123 additional time ($t_2$ minus $t_1$) to begin its operation for transferring data from buffer 131 to memory array 115 prior to memory array 115 beginning its operation for receiving the data from buffer 131. Similarly, independent of the timing of write clock signal 310, the rising edge of memory clock signal 320 arrives at a memory array 115 a period of time earlier than read clock signal 330 arrives at read control logic 127, illustrated as time $t_3$ minus time $t_2$. This gives read control logic 127 additional time ($t_3$ minus $t_2$) to begin operation for transferring data from memory arrays 115 to buffer 131 prior to read control logic 127 beginning the clock cycle in which it expects to receive the data.

It should be noted that there are limits to the amount of altering that can be done to clock signal paths. For example, the setup timing can be altered only so far as the hold timing is not violated. The exact limits of such altering is dependent on the timing requirements of the subsystems in which the present invention is used.

As illustrated in FIG. 3, the periods of clock signals 310, 320 and 330 are all the same. According to one embodiment of the present invention, the clock signals are skewed from each other by 10% to 20% of this clock period.

Returning to FIG. 1, in the illustrated embodiment clock signal paths 143 and 147 are traces on a PCB. The delay of signals on either path 143 or path 147 can be increased or decreased by modification of the appropriate trace on the PCB. Therefore, the read and write paths can each be independently compensated or varied at the board level without adversely affecting the other. Thus, it can be seen that no additional modifications to driver 110, memory arrays 115, or memory controller 120 are necessary to change the delays of either path 143 or path 147. It is to be appreciated that the present invention thus allows the read and write data paths to be independently compensated after manufacture of driver 110, arrays 115, and controller 120.

In alternate embodiments of the present invention, clock signal paths 145 clock one or the other of write control logic 123 or read control logic 127. According to one alternate embodiment, short clock signal path 143 is not included and an additional memory clock signal path 145 is included which provides a clock signal from driver 110 to write control logic 123. According to another alternate embodiment, long clock signal path 147 is not included and an additional memory clock signal path 145 is included which provides a clock signal from driver 110 to read control logic 127.

Figure 4:
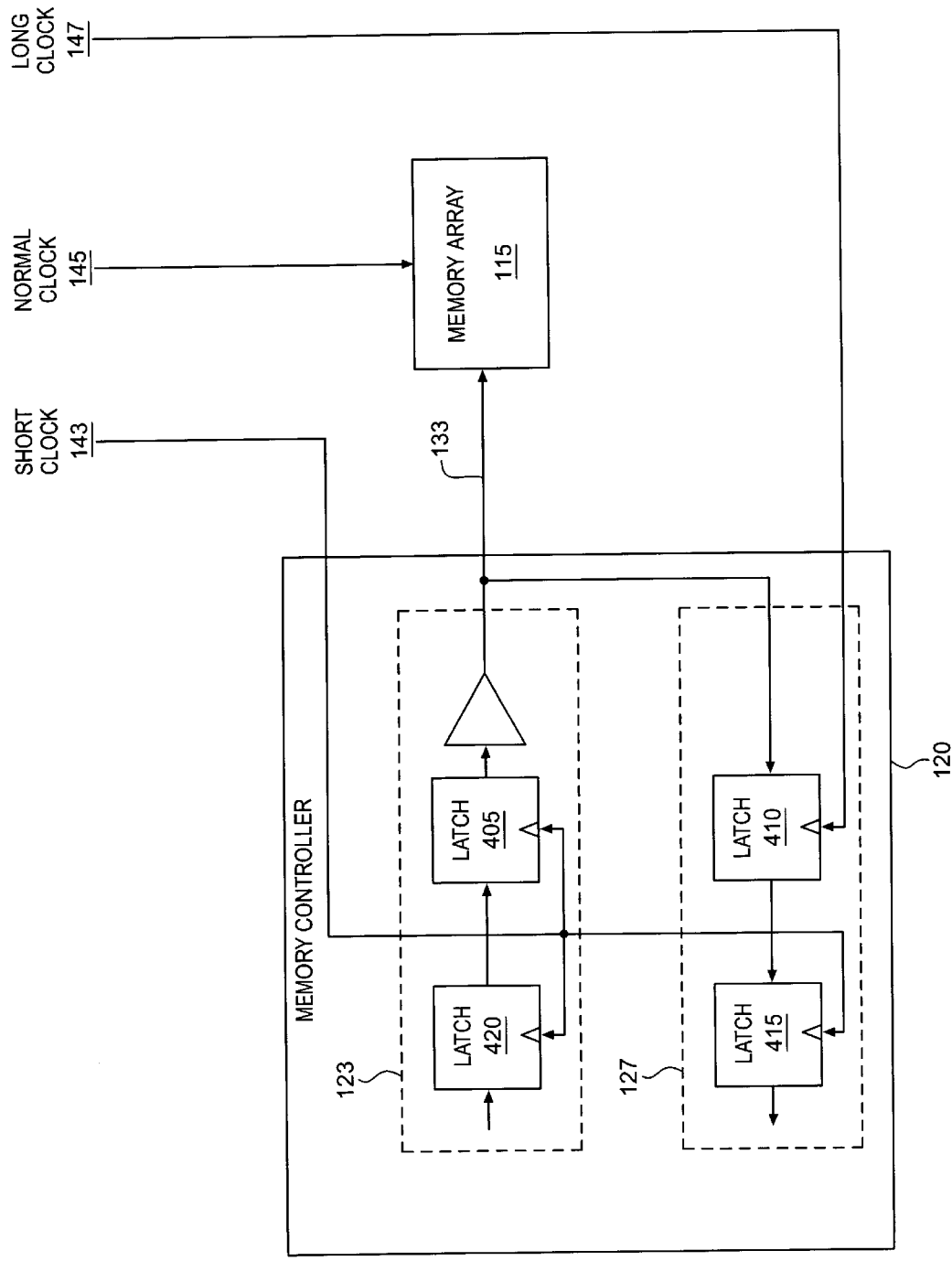
FIG. 4 is a block diagram illustrating read control logic and write control logic in more detail according to one embodiment of the present invention.

FIG. 4 is a block diagram illustrating read control logic and write control logic in more detail according to one embodiment of the present invention. As illustrated, write control logic 123 includes latches 405 and 420 clocked by the signal from short clock path 143. Read control logic 127 includes a latch 410 clocked by the signal from long clock path 147 and a latch 415 clocked by the signal from short clock path 143. Memory array 115 is clocked by the signal from "normal" clock path 145. Thus, three time domains are illustrated in FIG. 4. It is to be appreciated that additional internal control logic is included in memory controller 120 to control the reading, writing, and buffering of data being transferred to and from memory array 115. Such additional control logic within controller 120 is clocked by the signal from short clock path 143. Such additional logic is well-known to those skilled in the art and has not been shown so as not to clutter the drawings.

As illustrated in FIG. 4, the present invention allows the memory controller to make advantageous use of "time borrowing". Timing borrowing refers to the ability to "borrow" some time from a previous clock cycle(s) or another clock signal, thereby reducing timing constraints on the borrowing device. As illustrated, latch 415 is clocked from short clock signal path 143, whereas latch 410 is clocked from the long clock signal path 147. Thus, by clocking latch 415 earlier than latch 410, latch 410 borrows additional time from latch 415 when reading data from memory array 115. Thus, latch 410 has additional time to carry out its functions (receive data from memory array 115 via data line 133) relative to latch 415, thereby separating the setup and hold time constraints for memory array 115 transferring data to controller 120. The amount of time that is borrowed is the difference between the delay of short clock path 143 and the delay of long clock path 147. In addition, memory array 115 begins the process of sending data to controller 120 before latch 410 is clocked, thereby giving latch 410 additional time (the difference between the delay of long clock path 147 and normal clock path 145) to latch in data from data lines 133. Similarly, latch 405 begins providing data to memory array 115 before memory array 115 is clocked to receive the data, thereby giving memory array 115 additional time (the difference between the delay of normal clock path 145 and short clock path 143) to latch data in from data lines 133.

It should be noted that FIG. 4 illustrates the input and output latches for the read and write control circuitry of controller 120 for a single data signal line 133. It is to be appreciated that additional latches are used analogously for each additional data signal line 133 connecting controller 120 and memory array 115.

Figure 5:
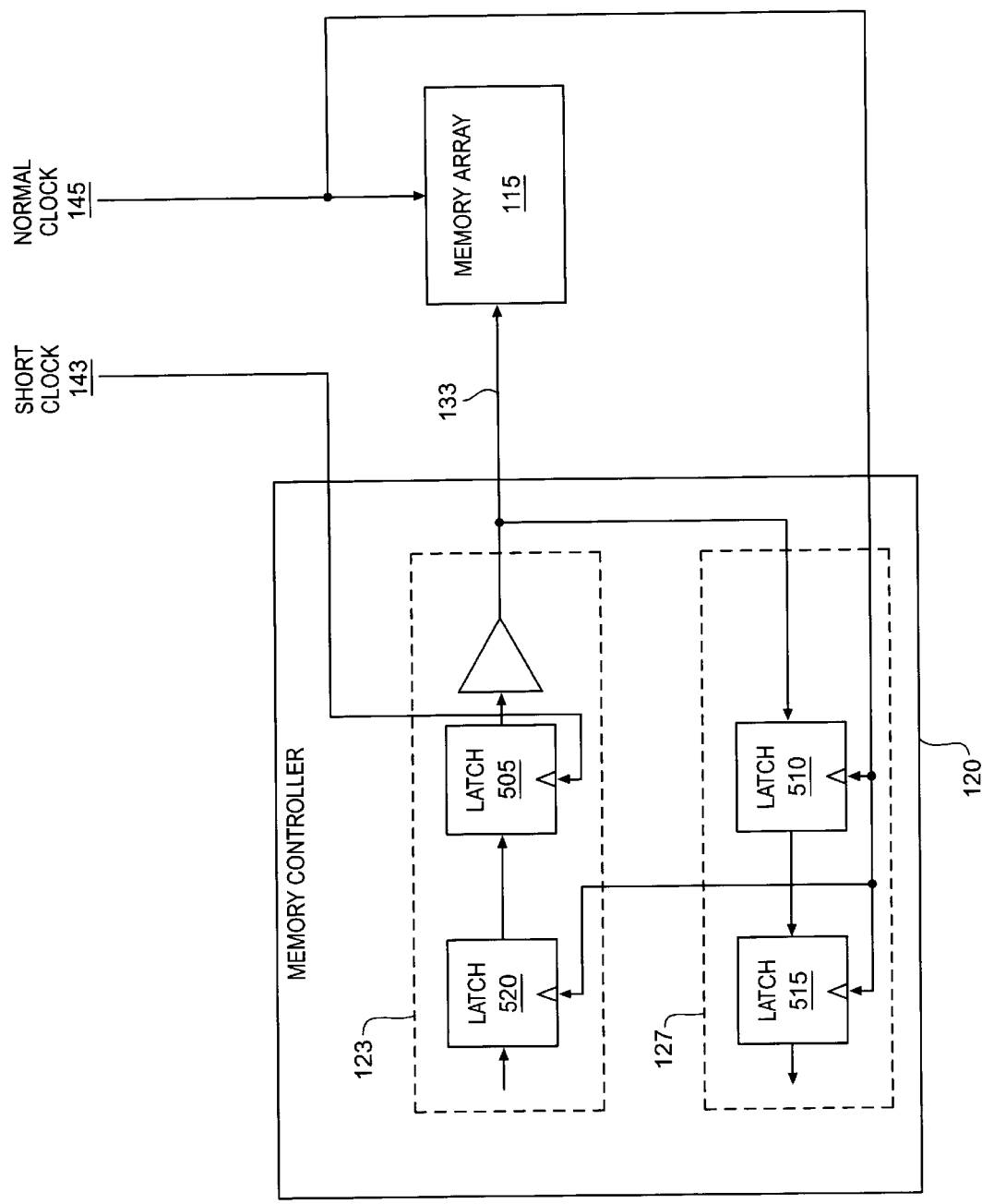
FIG. 5 is a block diagram illustrating read and write control logic in more detail according to another embodiment of the present invention.

FIG. 5 is a block diagram illustrating read and write control logic in more detail according to another embodiment of the present invention. The embodiment of FIG. 5 differs from that of FIG. 4 in that the three time domains of FIG. 4 have been replaced with two time domains. The long and normal clock paths have been combined into the same clock path in FIG. 5, illustrated as normal clock path 145. As illustrated, latch 505 of write control logic 123 is clocked by the signal from short clock path 143, whereas latch 520 is clocked by the signal from normal clock path 145. Latches 510 and 515 of read control logic 127 are both clocked by the signal from normal clock path 145, as is memory array 115.

As illustrated in FIG. 5, by clocking latch 505 earlier than latch 520, latch 505 borrows additional time from latch 520. Thus, latch 505 has additional time to carry out its functions (that is, provide data to memory array 115 via data line 133) relative to latch 520. The amount of time that is borrowed is the difference between the delay of short clock path 143 and the delay of normal clock path 145. In addition, latch 505 begins providing data to memory array 115 before memory array 115 is clocked to receive the data, thereby giving memory array 115 additional time (the difference between the delay of normal clock path 145 and the delay of short clock path 143) to latch in data from data line 133.

It should be noted that FIGS. 4 and 5 provide two example read and write control logic implementations of the present invention. However, additional implementations are also included within the spirit and scope of the present invention. Additionally, FIGS. 4 and 5 illustrate three different time domains. Alternate implementations, as discussed above, can include additional or fewer time domains.

Figure 6:
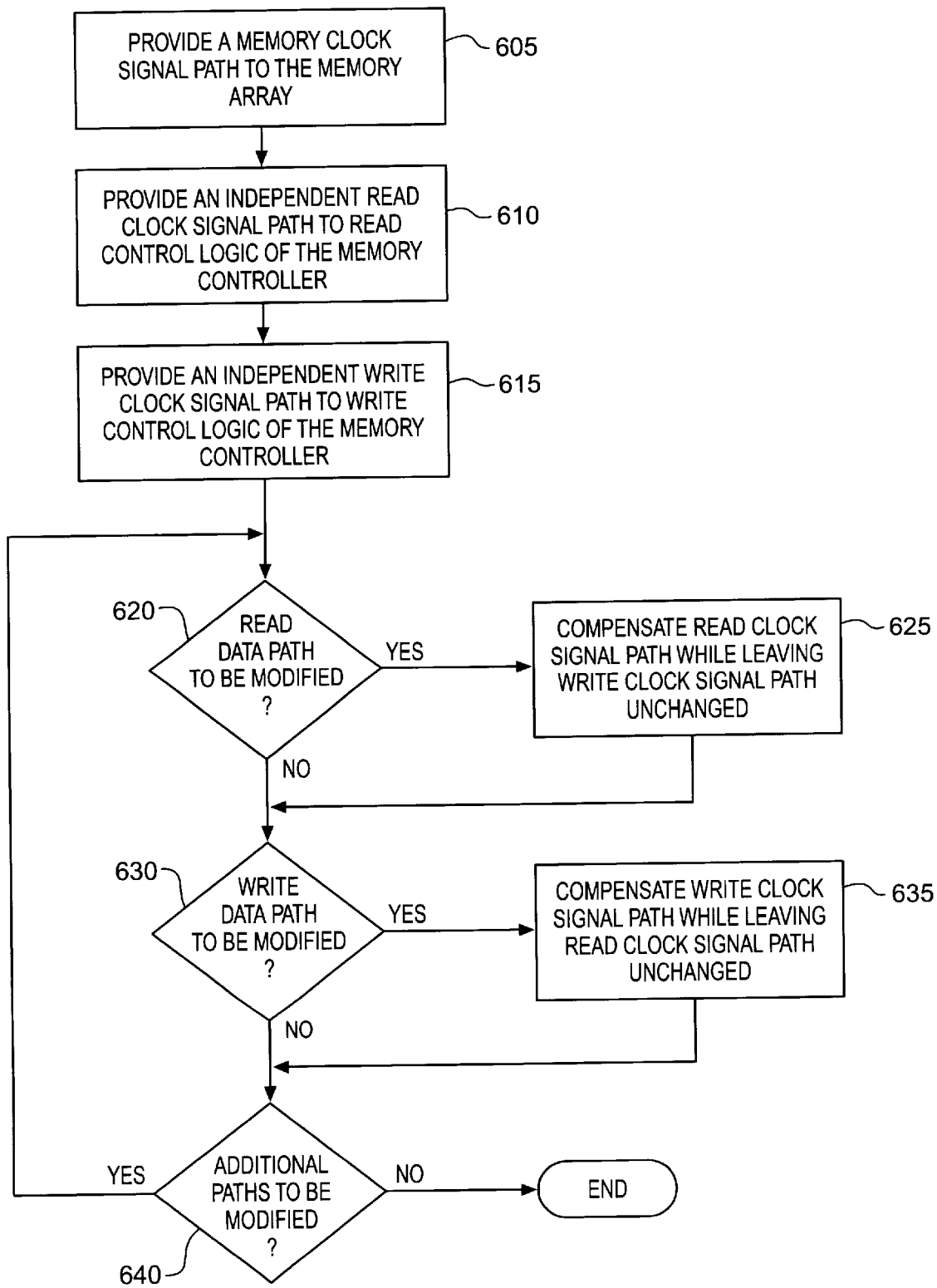
FIG. 6 is a block diagram illustrating the independent timing compensation of read and write data paths according to one embodiment of the present invention.

FIG. 6 is a block diagram illustrating the independent timing compensation of read and write data paths according to one embodiment of the present invention. In the illustrated embodiment, the process of FIG. 6 is carried out during the design of subsystem 100 of FIG. 1. As illustrated a memory clock signal path to the memory array(s) is provided, step 605. This memory clock signal path is to provide clock signals to the memory array(s). An independent read clock signal path is also provided to read control logic of the memory controller, step 610. This read clock signal path is to provide clock signals to the read control logic of the memory controller. An independent write clock signal path is also provided to write control logic of the memory controller, step 615. This write clock signal path is to provide clock signals to the write control logic of the memory controller. It should be noted that, in the illustrated embodiment, the delays of the write clock signal path and the read clock signal path are independent of each other, as well as independent of the delay of the memory clock signal path.

A check is then made as to whether the read data path is to be modified, step 620. The read data path can be modified, as discussed above, to either increase or decrease the delay of the read clock signal path. If the path is to be modified, then the read clock signal path is compensated for, or modified, while leaving the write clock signal path unchanged, step 625.

After step 620, and possibly step 625, processing continues at step 630, where a check is made as to whether the write data path is to be modified, step 630. If the path is to be modified, then the write clock signal path is compensated for, or modified, while leaving the read clock signal path unchanged, step 635.

After step 630, and possibly step 635, processing continues at step 640, where a check is made as to whether there are additional path modifications. If not, then the process ends. Otherwise, processing continues at step 620.

Given the independent nature of the read clock signal and write clock signal paths, these signal paths can be independently modified without affecting the other. Furthermore, no changes to the data signal paths are necessary despite changes to the read and write clock signal paths. Thus, it can be seen that the read and write data paths can be independently compensated despite the fact that they share a common bi-directional data bus to transfer data between the memory controller and the memory arrays.

Figure 7:
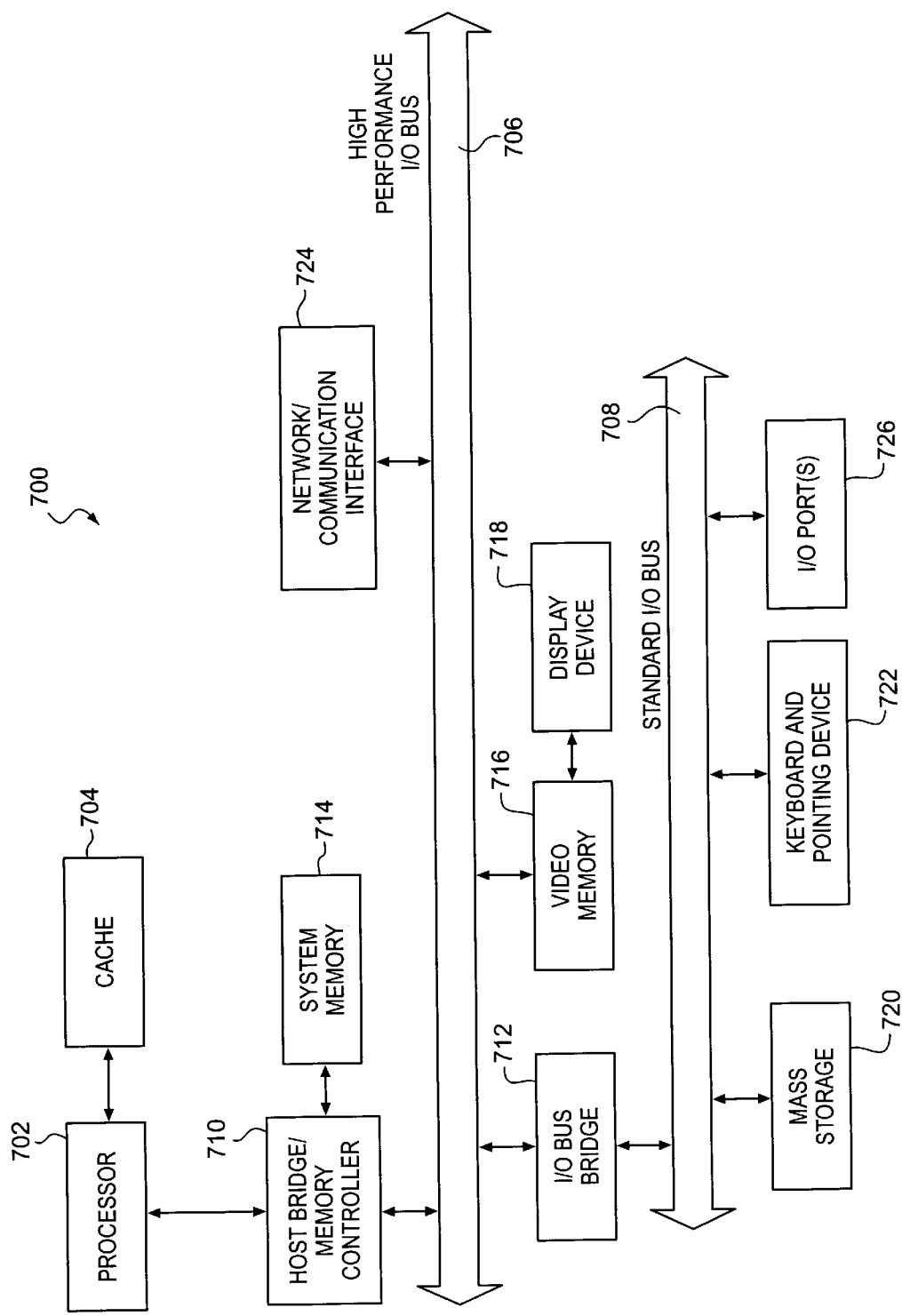
FIG. 7 illustrates a computer or hardware system incorporating one embodiment of the present invention.

FIG. 7 illustrates a computer or hardware system incorporating one embodiment of the present invention. In the illustrated embodiment, memory controller 120 and memory arrays 115 of FIG. 1 are bridge/memory controller 710 and system memory 714 of FIG. 7, respectively. In the illustrated embodiment, hardware system 700 includes processor 702 and cache memory 704 coupled to each other as shown.

Additionally, hardware system 700 includes high performance input/output (I/O) bus 706 and standard I/O bus 708. Host bridge/memory controller 710 couples processor 702 to high performance I/O bus 706, whereas I/O bus bridge 712 couples the two buses 706 and 708 to each other. Coupled to bus 706 are network/communication interface 724 and video memory 716. In turn, display device 718 is coupled to video memory 716. Coupled to bus 708 is mass storage 720, keyboard and pointing device 722, and I/O ports 726. Collectively, these elements are intended to represent a broad category of hardware systems, including but not limited to general purpose computer systems based on the Pentium® processor, Pentium® Pro processor, or Pentium® II processor manufactured by Intel Corporation of Santa Clara, Calif.

These elements 702–726 perform their conventional functions known in the art. In particular, network/communication interface 724 is used to provide communication between system 700 and any of a wide range of conventional networks, such as an Ethernet, token ring, the Internet, etc. It is to be appreciated that the circuitry of interface 724 is dependent on the type of network the system 700 is being coupled to.

I/O ports 726 are one or more serial and/or parallel communication ports used to provide communication between additional peripheral devices which may be coupled to hardware system 700.

It is to be appreciated that various components of hardware system 700 may be rearranged. For example, cache 704 may be on-chip with processor 702, or may be situated between processor 702 and bridge/controller 710. Alternatively, cache 704 and processor 702 may be packaged together as a "processor module" and attached to a "processor card", with processor 702 being referred to as the "processor core". Furthermore, certain implementations of the present invention may not require nor include all of the above components. For example, mass storage 720, keyboard and pointing device 722, and/or display device 718 and video memory 716 may not be included in system 700. Additionally, the peripheral devices shown coupled to standard I/O bus 708 may be coupled to high performance I/O bus 706; in addition, in some implementations only a single bus may exist with the components of hardware system 700 being coupled to the single bus. Furthermore, additional components may be included in system 700, such as additional processors, storage devices, or memories.

In alternate embodiments of the present invention, hardware system 700 is less complex than illustrated. By way of example, processor 702, system memory 714, and network/communication interface 724 could be implemented in a microcontroller or an application specific integrated circuit (ASIC).

In the discussions above, the present invention is described as being used with system memory. However, it is to be appreciated that the present invention can be used with any of a wide range of memories, including static random access memories (SRAMs), as well as other types of volatile and nonvolatile memories. Additionally, the present invention can be used with different components, including system memories, cache memories, video memories, etc. Furthermore, the present invention can be used with on-board memories of a device or device controller, such as a data buffer for a hard disk drive, CD-ROM, or digital versatile disk (DVD).

Also in the discussions above, the present invention is described as being implemented by altering signal paths at the board level. According to alternate embodiments, the present invention can be implemented inside either the memory controller or SDRAM. Additionally, in another alternate embodiment the present invention can be implemented in the clock driver(s). Thus, in these alternate embodiments the clock signal paths are adjusted in the silicon rather than at the board level.

According to one embodiment of the present invention, the synchronous components are rising-edge triggered. In alternate embodiments, the components may be falling-edge triggered, level triggered, or any combination of rising-edge, falling-edge, and level triggered.

Thus, independent timing compensation of write and read data paths on a common data bus has been described. Whereas many alterations and modifications of the present invention will be comprehended by a person skilled in the art after having read the foregoing description, it is to be understood that the particular embodiments shown and described by way of illustration are in no way intended to be considered limiting. References to details of particular embodiments are not intended to limit the scope of the claims.

What is claimed is:

1. An apparatus comprising:

a read clock path comprising a first trace, the read clock path having a first delay being attributable to a characteristic of the first trace, the read clock path to provide a read clock signal to a memory controller, wherein the read clock signal is to control timing of a memory controller when reading from a memory; and a write clock path comprising a second trace, the write clock path having a second delay being attributable to a characteristic of the second trace, the write clock path independently delay compensated from the read clock path, to provide a write clock signal to the memory controller, wherein the write clock signal is to control timing of the memory controller when writing to the memory.

2. The apparatus of claim 1, wherein the read clock signal is to control both timing of providing control signals to the memory controller and timing of receiving data signals from the memory controller.

3. The apparatus of claim 1, wherein the write clock signal is to control both timing of providing control signals to the memory controller and timing of providing data signals to the memory controller.

4. The apparatus of claim 1, further comprising a plurality of bi-directional data signal lines to bi-directionally transfer data signals between the memory controller and the memory.

5. The apparatus of claim 1, further comprising:

a memory clock path, coupled to provide a clock signal to the memory, wherein the clock signal is to control timing of the memory when transferring data to and from the memory.

6. The apparatus of claim 5, wherein the second delay of the write clock path relative to the memory clock path is variable and independent of the first delay of the read clock path relative to the memory clock path.

7. The apparatus of claim 1, wherein the write clock path provides a longer delay relative to the read clock path.

8. The apparatus of claim 1, wherein the read clock path provides a shorter delay relative to the write clock path.

9. The apparatus of claim 1, wherein the first delay of the read clock path is variable and independent of the second delay of the write clock path.

10. The apparatus of claim 1, further comprising:
a clock driver, coupled to provide a same clock signal to both the read clock path and the write clock path.

11. An apparatus as in claim 1, wherein the characteristic comprises a length.

12. An apparatus as in claim 1, wherein the characteristic comprises a width.

13. An apparatus as in claim 1, wherein the characteristic comprises a load.

14. An apparatus as in claim 1, wherein the characteristic comprises an impedance.

15. A memory controller comprising:
a first set of latches, operating in response to a first clock signal, to transfer data from a memory array; and
a second set of latches, operating in response to a second clock signal different from the first clock signal, to transfer data to the memory array.

16. The memory controller of claim 15, wherein the first set of latches includes a first subset of latches and a second subset of latches, and wherein the first subset of latches borrows time from the second subset of latches when transferring data from the memory array.

17. The memory controller of claim 15, wherein the first set of latches are coupled to a read clock path, wherein the second set of latches are coupled to a write clock path, and wherein a delay of the write clock path is independent of a delay of the read clock path.

18. A method comprising:
providing a read clock signal on a read clock path comprising a first trace, the read clock path having a first delay attributable to a characteristic of the first trace to control timing of a memory controller when reading from a memory; and
providing a write clock signal on a write clock path comprising a second trace, the write clock path having a second delay attributable to a characteristic of the second trace, the write clock path independently delay compensated from the read clock path to control timing of the memory controller when writing to the memory.

19. The method of claim 18, further comprising:
providing a memory clock signal to control timing of the memory when transferring data to and from the memory.

20. The method of claim 18, wherein a delay of the read clock path is variable and independent of a delay of the write clock path.

21. The method of claim 18, wherein a delay of the write clock path is variable and independent of a delay of the read clock path.

22. A system comprising:
one or more memory slots to receive one or more memory arrays;
one or more memory controllers, coupled to the one or more memory slots, to control reading from and writing to the one or more memory arrays;
a read clock path comprising a first trace, the read clock path having a first delay attributable to a characteristic of the first trace, coupled to the one or more memory controllers, to provide a read clock signal to the one or more memory controllers, wherein the read clock signal is to control timing of the one or more memory controllers when reading from the one or more memory arrays; and
a write clock path comprising a second trace, the write clock path having a second delay attributable to a characteristic of the second trace, coupled to the one or more memory controllers, to provide a write clock signal to the one or more memory controllers, wherein the write clock signal is to control timing of the one or more memory controllers when writing to the one or more memory arrays, and wherein the write clock path is independently delay compensated from the read clock path.

23. The system of claim 22, wherein the read clock signal is to control both timing of providing control signals to the memory controller and timing of receiving data signals from the memory controller.

24. The system of claim 22, wherein the write clock signal is to control both timing of providing control signals to the memory controller and timing of providing data signals to the memory controller.

25. The system of claim 22, wherein the one or more memory controllers are coupled to the one or more memory slots via a plurality of bi-directional data signal lines.

26. The system of claim 22, further comprising:
a memory clock path, coupled to provide a clock signal to the one or more memory arrays, wherein the clock signal is to control timing of the one or more memory arrays when transferring data to and from the one or more memory arrays.

27. The system of claim 22, wherein the write clock path provides a longer delay for a clock signal than the read clock path.

28. The system of claim 22, wherein a delay of the read clock path is variable and independent of a delay of the write clock path.

29. The system of claim 22, wherein a delay of the write clock path is variable and independent of a delay of the read clock path.

30. An apparatus comprising:
means for providing a read clock signal to a means for controlling a memory, the read clock signal on a read clock path comprising a first trace, the read clock path having a first delay attributable to a characteristic of the first trace, wherein the read clock signal is to control timing of the means for controlling a memory when reading from a memory; and
means for providing a write clock signal, independently delay compensated from the read clock path, to the means for controlling a memory, wherein the write clock signal is on a write clock path comprising a second trace, the write clock path having a second delay attributable to a characteristic of the second trace, and is to control timing of the means for controlling a memory when writing to the memory.

31. The apparatus of claim 30, further comprising:
means for providing a clock signal to the memory, wherein the clock signal is to control timing of the memory when transferring data to and from the memory.

32. The apparatus of claim 30, wherein the first delay of the read clock path is variable and independent of the second delay of the write clock path.

33. The apparatus of claim 30, wherein the first delay of the write clock path is variable and independent of the second delay of the read clock path.

* * * * *

UNITED STATES PATENT AND TRADEMARK OFFICE
CERTIFICATE OF CORRECTION

PATENT NO. : 6,128,748                                   Page 1 of 1
DATED      : October 3, 2000
INVENTOR(S) : MacWilliams et al.

It is certified that error appears in the above-identified patent and that said Letters Patent is hereby corrected as shown below:

<u>Column 1,</u>
Line 14, delete "Modem", insert -- Modern --.
Line 67, delete "modem", insert -- modern --.

<u>Column 2,</u>
Line 1, delete "modem", insert -- modern.--.

Signed and Sealed this

Twenty-eighth Day of May, 2002

Attest:

*Attesting Officer*

JAMES E. ROGAN
*Director of the United States Patent and Trademark Office*